United States Patent
Pedersen (10) Patent No.: US 11,862,749 B2
(45) Date of Patent: Jan. 2, 2024

(54) INTEGRATED MODULE ASSEMBLY FOR OPTICAL INTEGRATED CIRCUITS

(71) Applicant: Adesto Technologies Corporation, Santa Clara, CA (US)

(72) Inventor: Bard M. Pedersen, Fremont, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 17/109,316

(22) Filed: Dec. 2, 2020

(65) Prior Publication Data

US 2021/0175386 A1  Jun. 10, 2021

Related U.S. Application Data (60) Provisional application No. 62/944,533, filed on Dec. 6, 2019.

(51) Int. Cl.
| | |
|---|---|
| *H01L 31/173* | (2006.01) |
| *H01L 31/18* | (2006.01) |
| *H01L 31/0232* | (2014.01) |
| *H01L 31/02* | (2006.01) |

(52) U.S. Cl.
CPC ...... *H01L 31/173* (2013.01); *H01L 31/02005* (2013.01); *H01L 31/02325* (2013.01); *H01L 31/18* (2013.01)

(58) Field of Classification Search
CPC ............. H01L 31/173; H01L 31/02005; H01L 31/02325; H01L 31/18; H01L 31/153; H01L 31/162; H01L 25/167
See application file for complete search history.

(56) References Cited

U.S. PATENT DOCUMENTS

| | | | |
|---|---|---|---|
| 4,695,120 A | 9/1987 | Holder | |
| 6,527,458 B2 | 3/2003 | Kim | |
| 6,754,405 B2 | 6/2004 | Vendier et al. | |
| 7,063,467 B2 | 6/2006 | Nagasaka et al. | |
| 7,907,801 B2 * | 3/2011 | Kodama | G02B 6/138 |
| | | | 382/129 |
| 9,529,154 B2 | 12/2016 | Van Steenberge et al. | |
| 9,632,260 B2 | 4/2017 | Mizobuchi et al. | |
| 2004/0256349 A1 * | 12/2004 | Leib | H01L 31/02325 |
| | | | 257/E31.127 |
| 2006/0263003 A1 * | 11/2006 | Asai | H05K 1/0274 |
| | | | 257/E31.127 |
| 2007/0297713 A1 * | 12/2007 | Lu | G02B 6/4246 |
| | | | 385/14 |
| 2007/0297729 A1 * | 12/2007 | Kodama | H05K 1/0274 |
| | | | 385/94 |
| 2010/0215317 A1 | 8/2010 | Rolston et al. | |
| 2013/0009173 A1 * | 1/2013 | Vittu | G01S 7/4813 |
| | | | 257/E33.056 |
| 2013/0148978 A1 | 6/2013 | Miao et al. | |
| 2016/0306042 A1 * | 10/2016 | Schrank | H01L 27/1443 |
| 2018/0329065 A1 * | 11/2018 | Pacala | H01L 27/1446 |

* cited by examiner

*Primary Examiner* — Dao H Nguyen (57) ABSTRACT

An integrated module assembly can include: an optical integrated circuit having first and second optical devices; a PCB having first and second holes therein, where the optical integrated circuit is coupled upside down to a first side of the PCB; and first and second lenses coupled to a second side of the PCB, where the first and second sides of the PCB are opposite thereto; and where the first lens is in alignment with the first hole and the first optical device, and the second lens is in alignment with the second hole and the second optical device.

14 Claims, 11 Drawing Sheets

INTEGRATED MODULE ASSEMBLY FOR OPTICAL INTEGRATED CIRCUITS

RELATED APPLICATIONS

This application claims the benefit of U.S. Provisional Application No. 62/944,533, filed Dec. 6, 2019, and which is incorporated herein by reference in its entirety.

FIELD OF THE INVENTION

The present invention generally relates to the field of optical devices and assemblies. More specifically, embodiments of the present invention pertain to optical devices involving wafer level chip scale package (WLCSP) and printed-circuit board (PCB) devices.

BACKGROUND

Assembly of integrated circuits containing optical devices (e.g., transmitters and/or receivers) tends to be more expensive than assembly of other components. Particularly, it can be difficult for optical ICs to take advantage of WLCSP assembly, as the active surface of the device faces down toward a PCB that is typically opaque.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Figure 1:
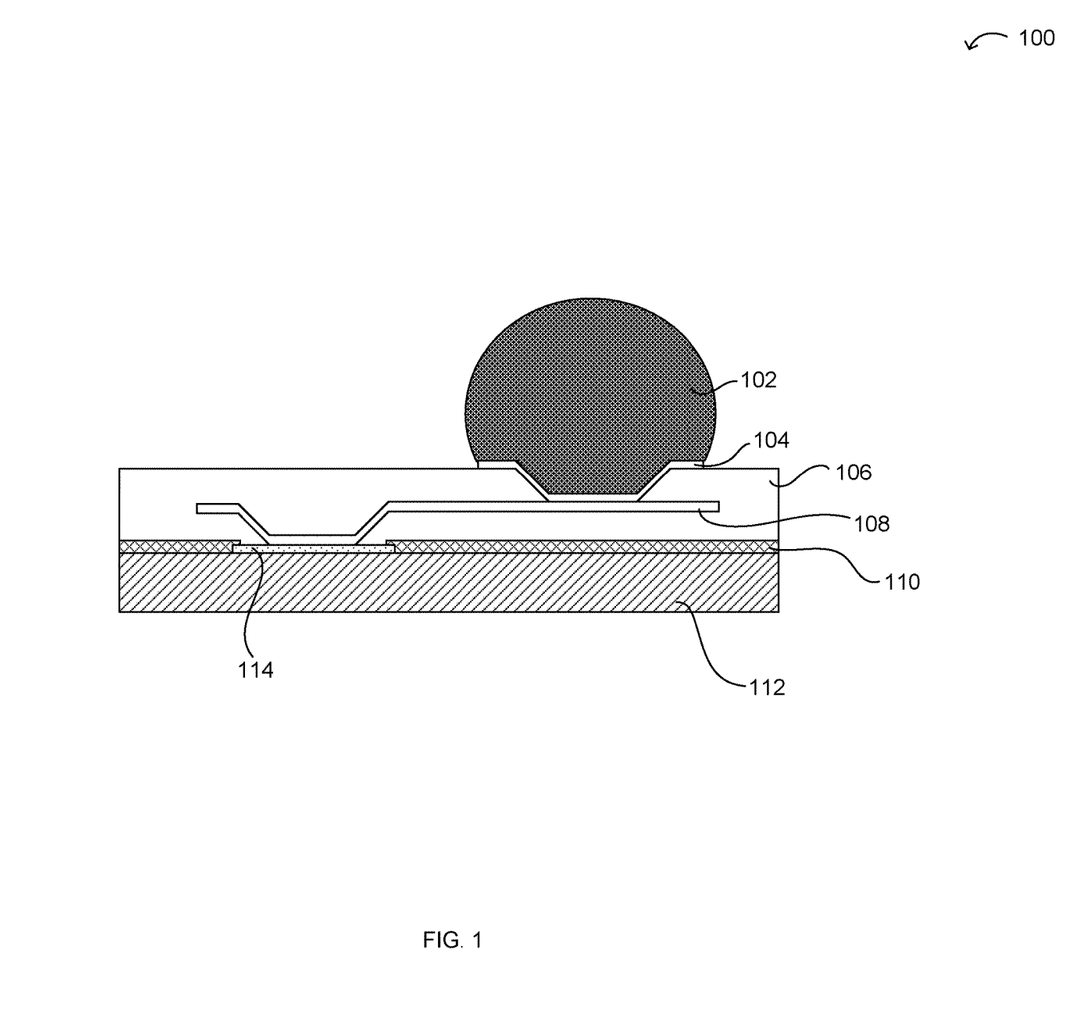
FIG. 1 is an example application using the module assembly, in accordance with embodiments of the present invention.

Referring now to FIG. 1, shown is an example application using the module assembly, in accordance with embodiments of the present invention. In example 100, a redistribution layer (RDL) as used in wafer level chip scale packaging (WLCSP) is shown. WLCSP refers to the technology of packaging an integrated circuit at a wafer level, resulting in a device that is practically the same size as the die. While the name implies devices would be packaged, the bare die can actually be modified to add environmental protection layers and solder balls that are then used as the direct connection to the package carrier or substrate. WLCSP technology can allow devices to be integrated in the design by using the smallest possible form factor, and WLCSP devices may require no additional process steps on surface mount assembly lines.

In WLCSP, the bare die can be processed to have solder balls attached directly to the device, which may remove the need for external casing and wiring in some cases. In this particular example, silicon die 112 can be covered with a nitride passivation layer (e.g., 110), except for pad openings (e.g., 114) in some cases. For example, RDL 108 can be used to route between pad 114 and a region for external connectivity. A polymer dielectric (e.g., 106) can then be added, followed by deposition of under bump metallization (UBM), such as 104. A solder ball (e.g., 102) can then be attached to each UBM pad. After processing, the device can be a die with an array pattern of solder balls, which may then be attached at a pitch that is comparable to traditional circuit board (e.g., printed-circuit board [PCB]) assembly processes. In this way, there may be no need for external packaging material in order to protect the chip. In particular embodiments, optical transceivers and/or optical receivers can be implemented in WLCSP technology, and then may be connected to a corresponding PCB to form a full integrated module assembly.

Figure 2:
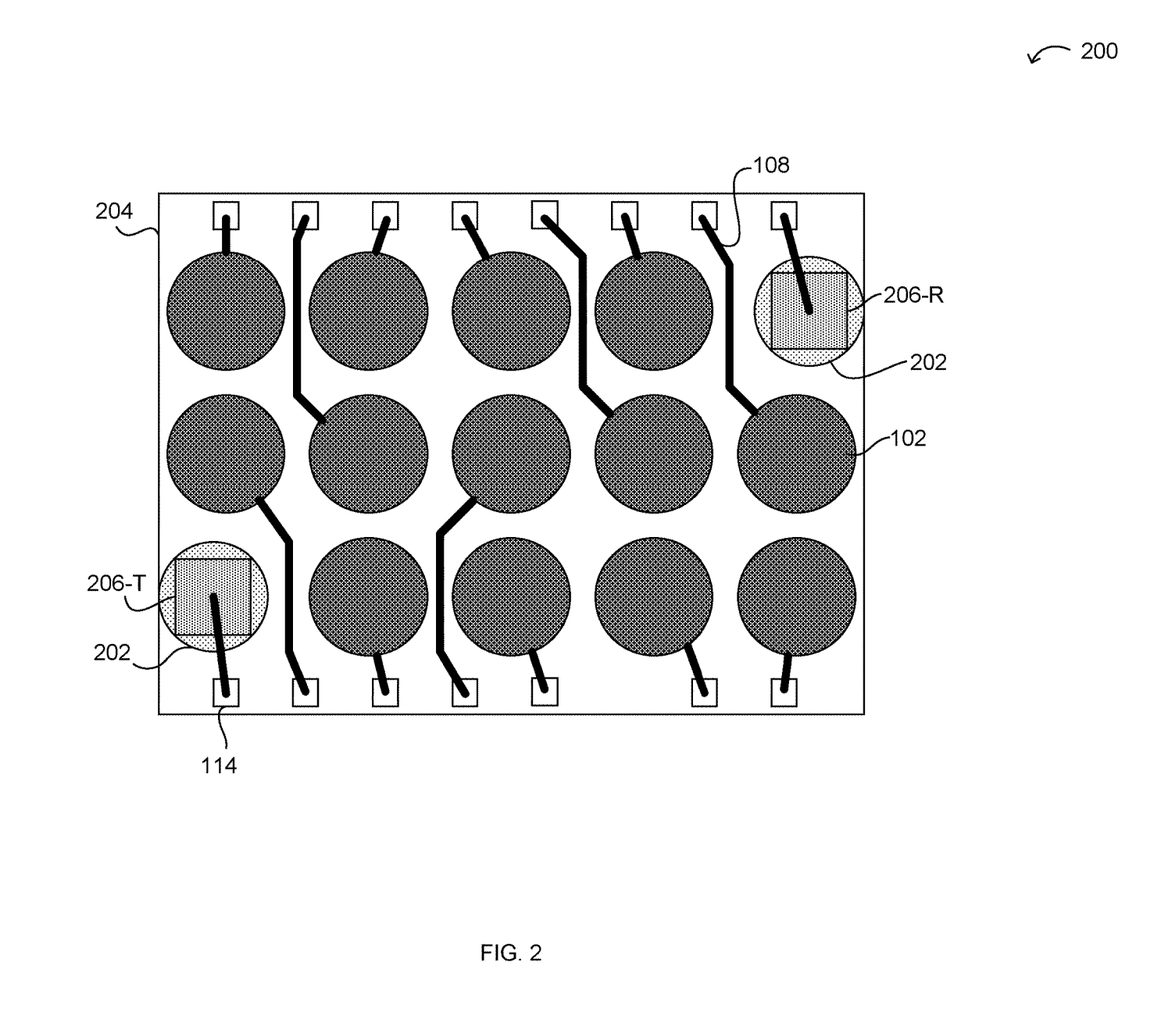
FIG. 2 is an example WLCSP device, in accordance with embodiments of the present invention.

Referring now to FIG. 2, shown is an example WLCSP device (top view), in accordance with embodiments of the present invention. Example 200 is one particular example of an optical module in WLCSP device implementation. In addition to optical module implementation, such technology may be used in supporting analog and digital circuitry. In this particular example, optical transmitter 206-T and optical receiver 206-R can be on opposite sides at the edges of the WLCSP/die 204. This arrangement allows multiple rows of blocking balls (e.g., 102) and vias to be placed between the optical transmitter and receiver. Balls 102 can be near the edge of the die, but not exactly where the optical transmitter/receiver are located. Lenses 202 can be in alignment with the corresponding optical device 206.

In one embodiment, an integrated module assembly can include: (i) an optical integrated circuit having first and second optical devices; (ii) a PCB having first and second holes therein, where the optical integrated circuit is coupled upside down to a first side of the PCB; and (iii) first and second lenses coupled to a second side of the PCB, where the first and second sides of the PCB are opposite thereto; and (iv) where the first lens is in alignment with the first hole and the first optical device, and the second lens is in alignment with the second hole and the second optical device.

In one embodiment, an integrated module assembly can include: (i) an optical integrated circuit comprising first and second optical devices; (ii) a PCB having first and second clear regions therein, where the optical integrated circuit is coupled upside down to a first side of the PCB; (iii) first and second lenses coupled to the first side of the PCB; and (iv) where the first lens is in alignment with the first clear region and the first optical device, and the second lens is in alignment with the second clear region and the second optical device.

In one embodiment, a method of making an integrated module assembly can include: (i) forming an optical integrated circuit comprising first and second optical devices; (ii) forming a PCB having first and second clear regions therein; (iii) arranging the optical integrated circuit upside down on the PCB; (iv) forming first and second lenses on the PCB; and (v) aligning the first lens with the first clear region and the first optical device, and aligning the second lens with the second clear region and the second optical device.

In particular embodiments, by using an optically clear PCB, the PCB may no longer block light to and from the active surface of the die that includes optical devices. In some cases, the PCB may be used directly as the optical sensor window in the housing of the final product. As an example of an application using this assembly technology, an optical distance detector can include an integrated circuit having an optical transmitter (e.g., light-emitting diode [LED], vertical-cavity surface-emitting laser [VCSEL], etc.) and one or more optical receivers (e.g., PIN diodes, etc.), in addition to analog and digital circuitry.

A VCSEL is a type of semiconductor laser diode with laser beam emission perpendicular from the top surface, as opposed to edge-emitting semiconductor lasers or in-plane lasers that emit from surfaces formed by cleaving the individual chip out of a wafer. VCSELs are used in various laser products, including computer mice, fiber optic communications, laser printers, Face ID, and smart glasses. A PIN diode is a diode with a wide, undoped intrinsic semiconductor region between a p-type semiconductor and an n-type semiconductor region. The p-type and n-type regions are typically heavily doped because they are used for ohmic contacts. The wide intrinsic region makes this device particularly suitable for attenuators, fast switches, photodetectors, and high voltage power electronics applications.

The LED may alternatively be a separate die or "chiplet" made in a different process technology than the rest of the circuit, as LEDs are typically made in a technology that is difficult to integrate with standard CMOS devices. The LED transmitter may thus be a separate die from the rest of the circuit, or it may be a chiplet that is mounted of the surface of the main die. The optical receiver (e.g., phototransistor, PIN diode, etc.) may be integrated on the main die, or this may be a chiplet or separate die as well. An "optical device" as described herein can be an optical transmitter or an optical receiver.

WLCSP assembly can include layers of copper (e.g., RDL) and insulators. The materials used for insulation are transparent for most wavelengths, including infrared (IR). One of the materials that can be used for repassivation is a polyimide (e.g., Kapton, which is transparent in infrared). This material typically blocks blue and green light, but for WLCSP, the layers are so thin that the material may be partially transparent also for green and blue. In certain embodiments, one or more optical devices can be integrated with, or otherwise attached thereto, the WLCSP assembly. An "optical integrated circuit" as described herein can include, e.g., the WLCSP assembly/structure that includes one or more optical devices.

Figure 3:
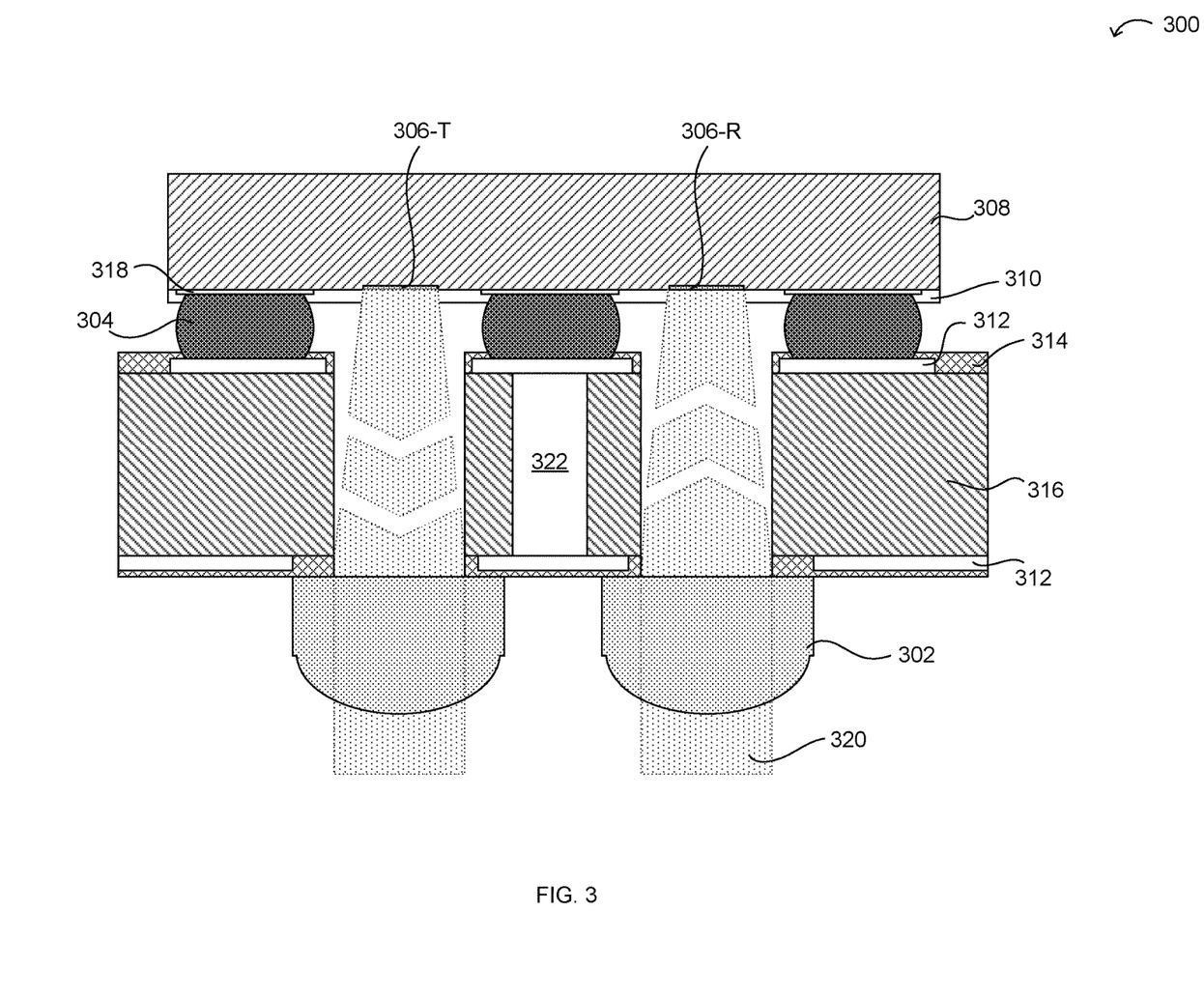
FIG. 3 is an example individual lens device, in accordance with embodiments of the present invention.

Referring now to FIG. 3, shown is an example individual lens device, in accordance with embodiments of the present invention. For a WLCSP device, the optical sensors (e.g., light receivers) can be mounted upside down toward the PCB. For example, "holes" or otherwise clear regions can be formed in the PCB for the optical sensor to see the outside world. In particular embodiments, actual holes can be formed in the PCB, and/or optically clear regions can be formed in the PCB. In addition, the light transmitters (e.g., LED, VCSEL, etc.) can also be mounted downward toward the PCB in alignment with holes/clear regions therein. Further, lenses can be included that are attached to the PCB, and/or are formed within the PCB itself in some cases.

In example 300, the WLCSP can include silicon die 308 with optical receiver 306-R and optical transmitter 306-T, as well as repassivation layer(s) and polyimide (e.g., Kapton) 310, UBM 318, and solder balls 304. The PCB can include PCB traces/pads 312, PCB solder mask 314, and PCB core 316. In addition, via 322 can be included in PCB core 316 in order to form connections PCB traces and pads 312. In example 300, the lenses 302 may be individual lenses (e.g., one for the optical transmitter and one for the optical receiver), and light beams 320 can be as shown emanating from optical transmitter 306-T, and coming into optical receiver 306-R.

Depending on which particular WLCSP technology is used, 318 may be just the under bump metallization, or can be both the UBM and RDL, as this particular example does not differentiate between the two. Also, UBM may or may not be a separate layer, depending on the particular WLCSP technology used. In 1, the UBM is shown as a separate layer. In some WLCSP technologies, bumps may be placed directly on die pads, but usually a UBM layer is still used. RIM, may be utilized when the bumps need to be in a different physical location than the pads (see, e.g., FIG. 2). RDL is typically a single layer on the die, but multi-layer RDL can also be used in some cases. In particular embodiments, any suitable WLCSP technology may be employed in order to implement the optical integrated circuit. In this particular case, a 2-layer PCB is shown; however, a multi-layer PCB or even a single-layer PCB can be utilized in certain embodiments.

Figure 4:
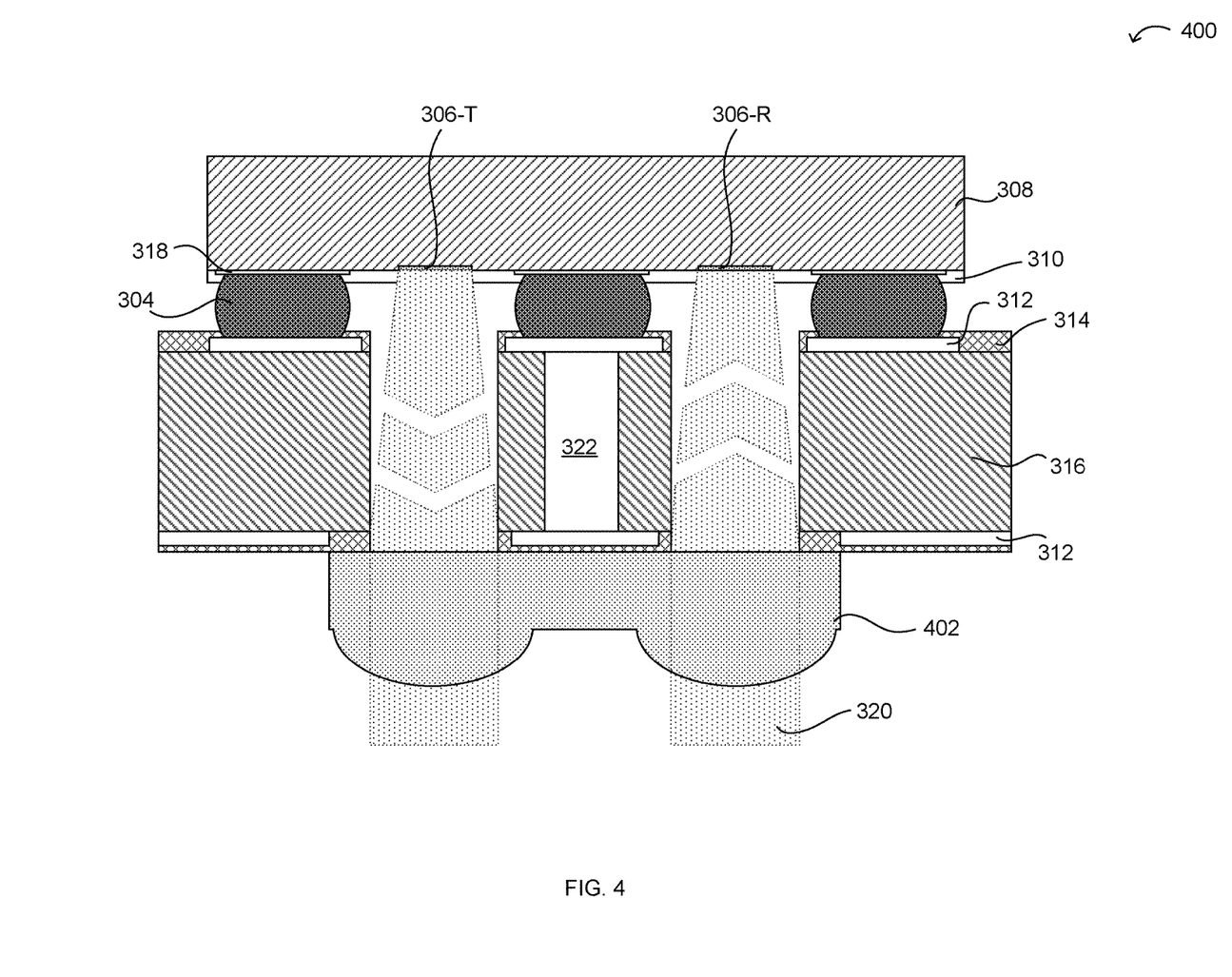
FIG. 4 is an example multiple lens device, in accordance with embodiments of the present invention.

Referring now to FIG. 4, shown is an example multiple lens device, in accordance with embodiments of the present invention. In example 400, a cast module that includes multiple lenses can be utilized can be utilized instead of individual lenses for each optical device. In example 400, the WLCSP can include silicon die 308 with optical receiver 306-R and optical transmitter 306-T, as well as repassivation layer(s)/polyimide 310, UBM 318, and solder balls 304. The PCB can include PCB traces/pads 312, PCB solder mask 314, and via 322 in PCB core 316 to connect PCB traces and pads 312. As shown, light beams 320 can be transmitted from optical transmitter 306-T, and light beams can be received by optical receiver 306-R. In example 400, lenses 402 may be a cast module that includes multiple lenses with curved lens shapes corresponding to each optical device, as well as a common flat surface that mounts to the bottom of the PCB.

Figure 5:
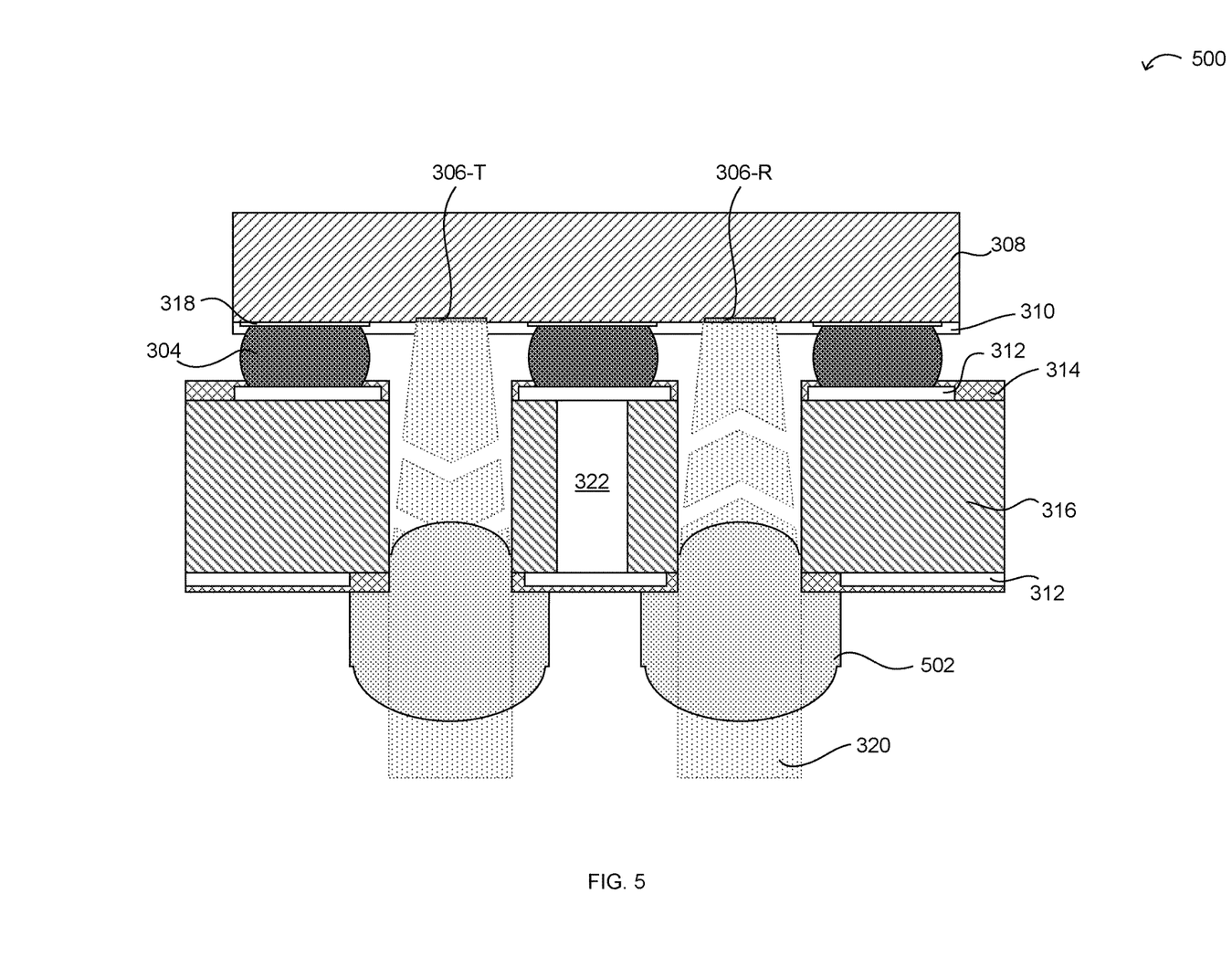
FIG. 5 is an example device with lenses using PCB holes for alignment, in accordance with embodiments of the present invention.

Referring now to FIG. 5, shown is an example device with lenses using PCB holes for alignment, in accordance with embodiments of the present invention. In example 500, the WLCSP can similarly include silicon die 308 with optical receiver 306-R and optical transmitter 306-T, as well as repassivation layer(s)/polyimide 310, UBM 318, and solder balls 304. The PCB can include PCB traces/pads 312, PCB solder mask 314, and PCB core 316, and via 322 in PCB core 316 to connect PCB traces and pads 312. As shown, light beams 320 can be transmitted from optical transmitter, and light beams can be received by optical receiver 306-R. In example 500, lenses 502 can use the holes in the PCB for alignment. As such, lenses 502 can be partially within the PCB holes and partially outside of the holes. Lenses 502 can have curved surfaces that fit within the corresponding holes on one side, and another curved surface on the other side. This arrangement may allow for improved alignment between the lens, hole, and corresponding optical device 306.

Figure 6:
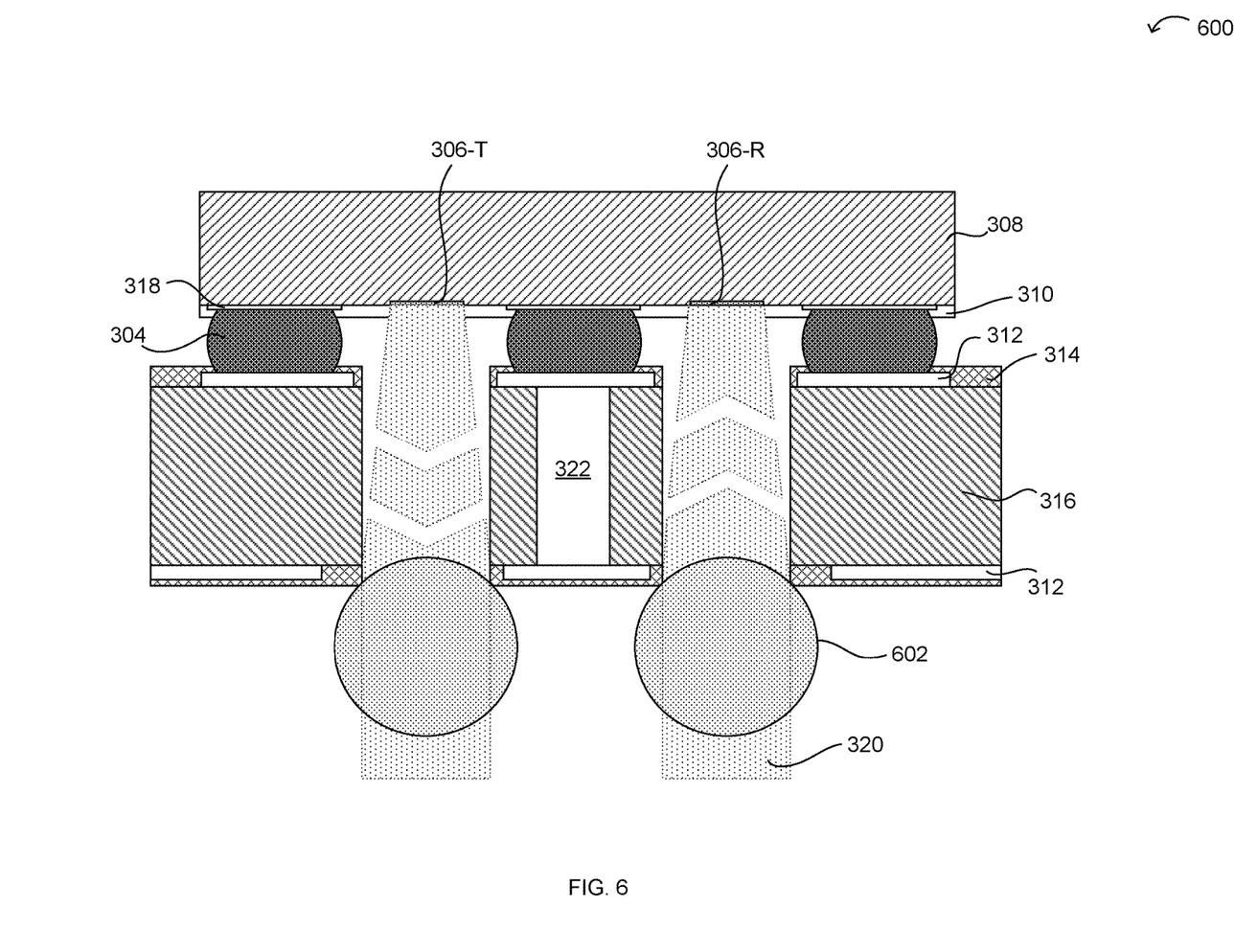
FIG. 6 is an example device with spherical ball lenses that fit in the PCB hole, in accordance with embodiments of the present invention.

Referring now to FIG. 6, shown is an example device with spherical ball lenses that fit in the PCB hole, in accordance with embodiments of the present invention. In example 600, the WLCSP can similarly include silicon die 308 with optical receiver 306-R and optical transmitter 306-T, as well as repassivation layer(s)/polyimide 310, UBM 318, and solder balls 304. The PCB can include PCB traces/pads 312, PCB solder mask 314, and PCB core 316, and via 322 can be included in PCB core 316 to connect PCB traces and pads 312. As shown, light beams 320 can be transmitted from/to optical transmitter 306-T and optical receiver 306-R. In example 600, lenses 602 can be spherical ball lenses that fit in the PCB hole. As such, lenses 602 can be partially within the PCB holes and partially outside of the holes, while maintaining the spherical ball shape. Lenses 602 can be perfect spheres, or may be more elliptical in some cases. The particular type of lenses utilized in certain embodiments can depend on the optical requirements of the given application.

Figure 7:
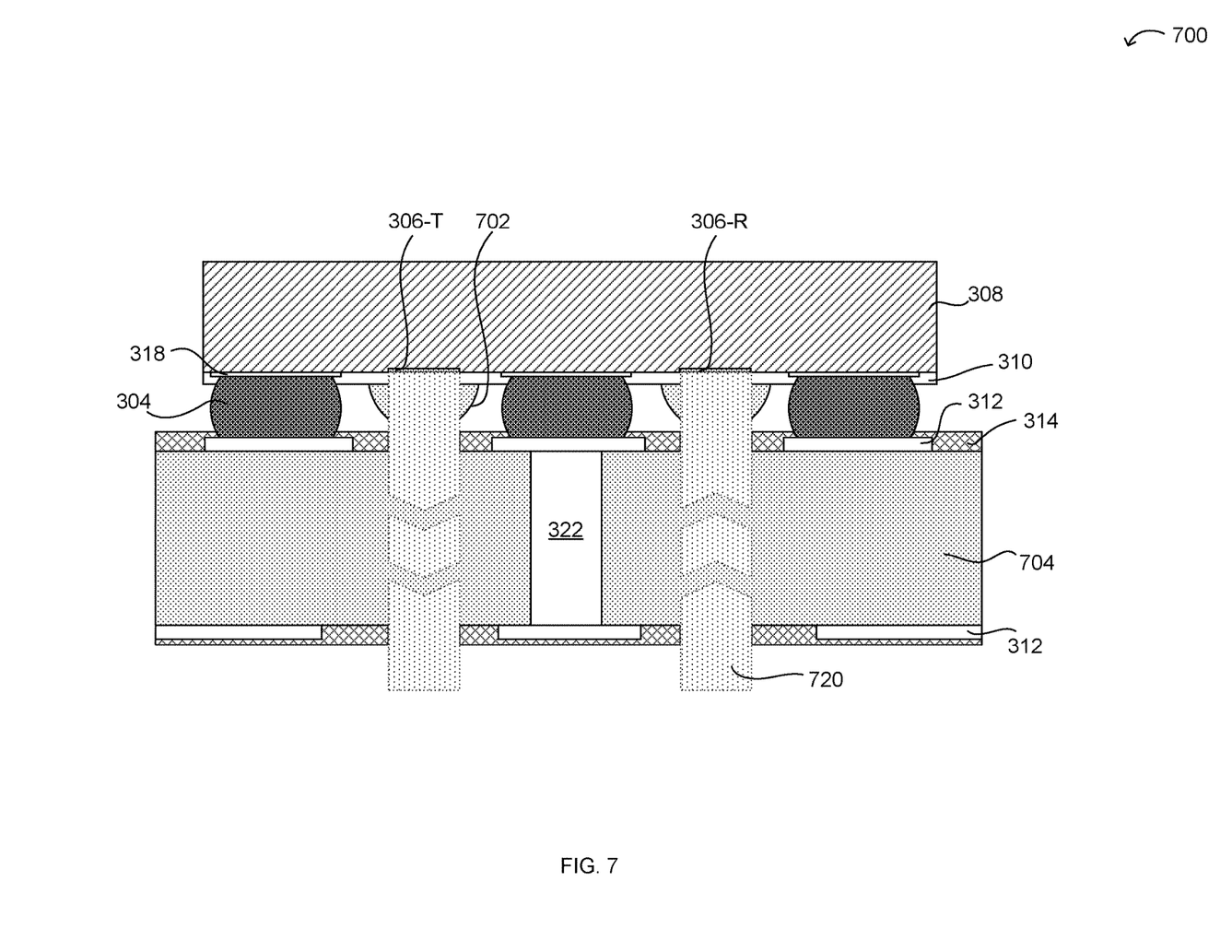
FIG. 7 is a first example clear PCB device, in accordance with embodiments of the present invention.

Referring now to FIG. 7, shown is a first example clear PCB device, in accordance with embodiments of the present invention. This particular example utilizes a clear and flat PCB. In example 700, the WLCSP can include silicon die 308 with optical receiver 306-R and optical transmitter 306-T, as well as repassivation layer(s)/polyimide 310, UBM 318, and solder balls 304. The PCB can include PCB traces/pads 312, PCB solder mask 314, and PCB core 704, and via 322 can be included in PCB core 704 to connect between PCB traces and pads 312. As shown, light beams 720 can be transmitted from optical transmitter 306-T, and light beams may be received by optical receiver 306-R. For example, PCB core 704 can be an optically clear material, and in particular may have clear regions corresponding to the optical devices and lenses, such as in place of holes in the PCB.

In particular embodiments, a clear PCB can be employed as shown, and such a clear PCB may also shield the surface of the die from the outside environment. Thus, the clear regions as described herein can include substantial portions of the PCB, but designated clear regions/holes may be aligned with optical transceiver 306-T and optical receiver 306-R. The clear PCB in this case can also serve as the external window of the optical structure, thereby reducing both cost and size of the final module. In example 700, lenses 702 can be spherical ball lenses on one side and flat surfaces on the other, and that may at least partially fit in, or are otherwise aligned with, the PCB hole. Further, lenses 702 in this example can be arranged between the WLCSP and the PCB, as opposed to being located on the bottom of the PCB.

Figure 8:
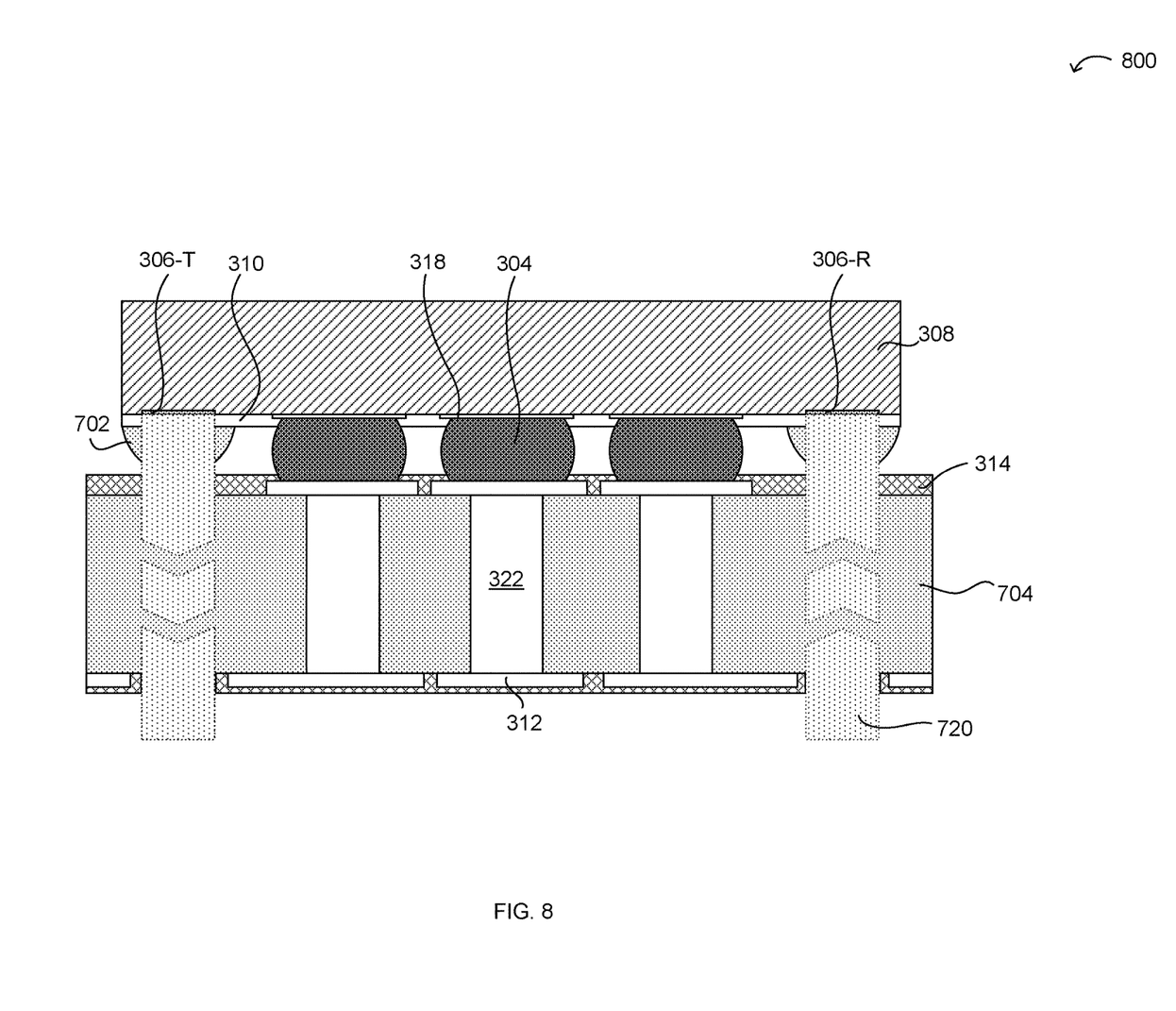
FIG. 8 is a second example clear PCB device, in accordance with embodiments of the present invention.

Referring now to FIG. 8, shown is a second example clear PCB device, in accordance with embodiments of the present invention. In example 800, a clear PCB that is flat is shown. In example 800, the WLCSP can similarly include silicon die 308 with optical receiver 306-R and optical transmitter 306-T, as well as repassivation layer(s)/polyimide 310, UBM 318, and solder balls 304. The PCB can include PCB traces/pads 312, PCB solder mask 314, and PCB core 704, and vias 322 formed in PCB core 704 to connect between PCB traces and pads 312. As shown, light beams 720 can be transmitted from optical transmitter 306-T. In addition, light beams can be received by optical receiver 306-R. In example 800, lenses 702 can be spherical ball lenses on one side and flat surfaces on the other, and that may at least partially fit in, or are otherwise aligned with, the PCB hole. In this example, the optical transmitter 306-T and optical receiver 306-R are placed father apart in order to substantially avoid optical interference. Multiple solder balls 304 and vias 322 can further block such interference between the optical devices 306.

Figure 9:
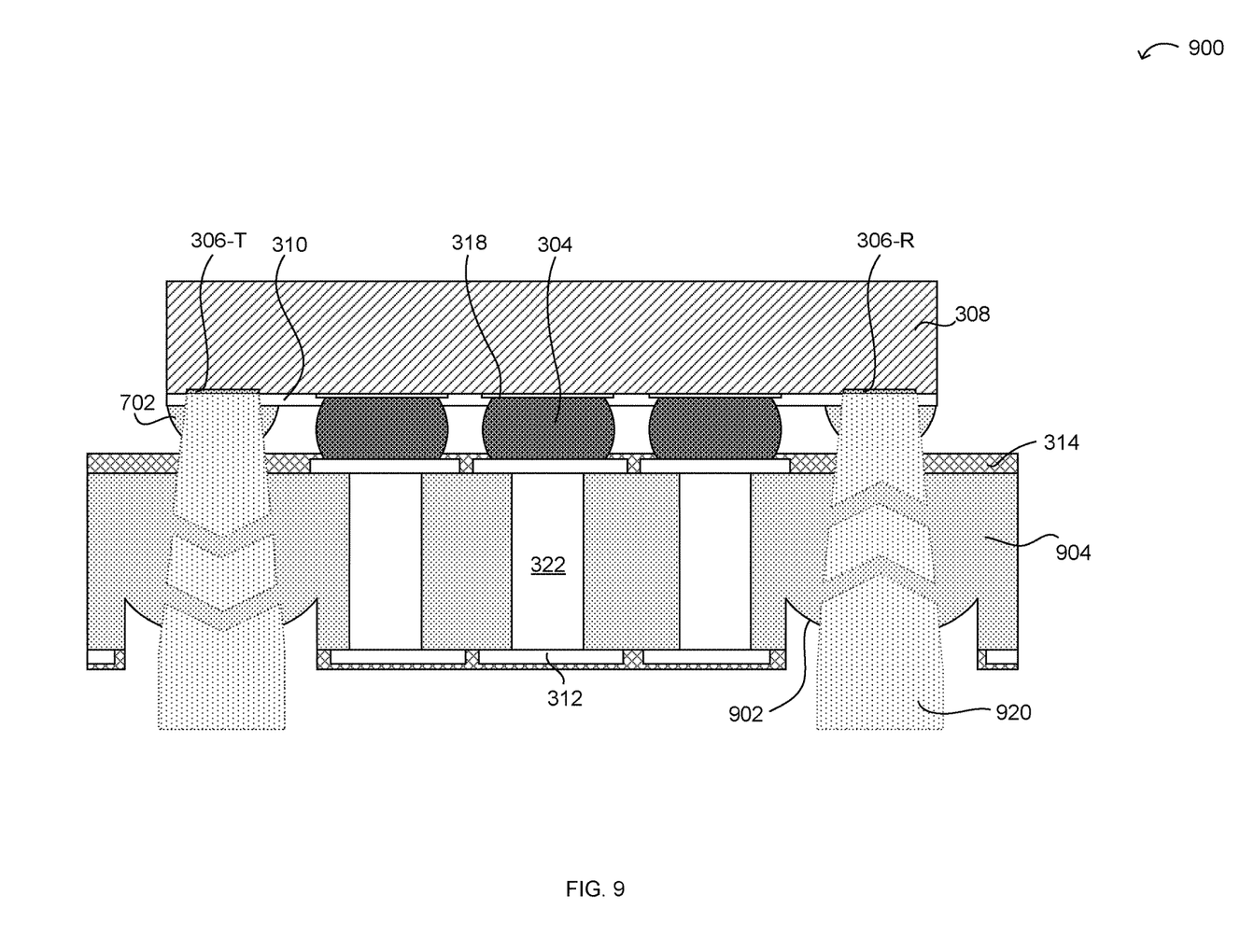
FIG. 9 is a third example clear PCB device, in accordance with embodiments of the present invention.

Referring now to FIG. 9, shown is a third example clear PCB device, in accordance with embodiments of the present invention. In example 900, the clear PCB may be shaped to act as a lens itself (e.g., 902) for the transmitted and received light beams 920. In example 900, the WLCSP can include silicon die 308 with optical receiver 306-R and optical transmitter 306-T, as well as repassivation layer(s)/polyimide 310, UBM 318, and solder balls 304. The PCB can include PCB traces/pads 312, PCB solder mask 314, and PCB core 904, and vias 322 formed in PCB core 704 to connect PCB traces and pads 312. As shown, light beams 920 can be transmitted from optical transmitter 306-T, and light beams can be received by optical receiver 306-R.

In example 900, additional lenses 702 can be shaped within the PCB hole itself between the WLCSP and the PCB, and/or lenses may be formed as a curved shape 902 within PCB core 904. In some cases, curved lens 902 can be the only lens utilized for each optical device, while in other cases both of lenses 702 and 902 can be utilized in alignment with the corresponding optical device. Any suitable curved shape 902 for forming an optical lens can be employed in certain embodiments. In addition, the optical transmitter 306-T and optical receiver 306-R can similarly be placed father apart and with multiple solder balls and vias 322 therebetween in order to substantially avoid optical interference.

Figure 10:
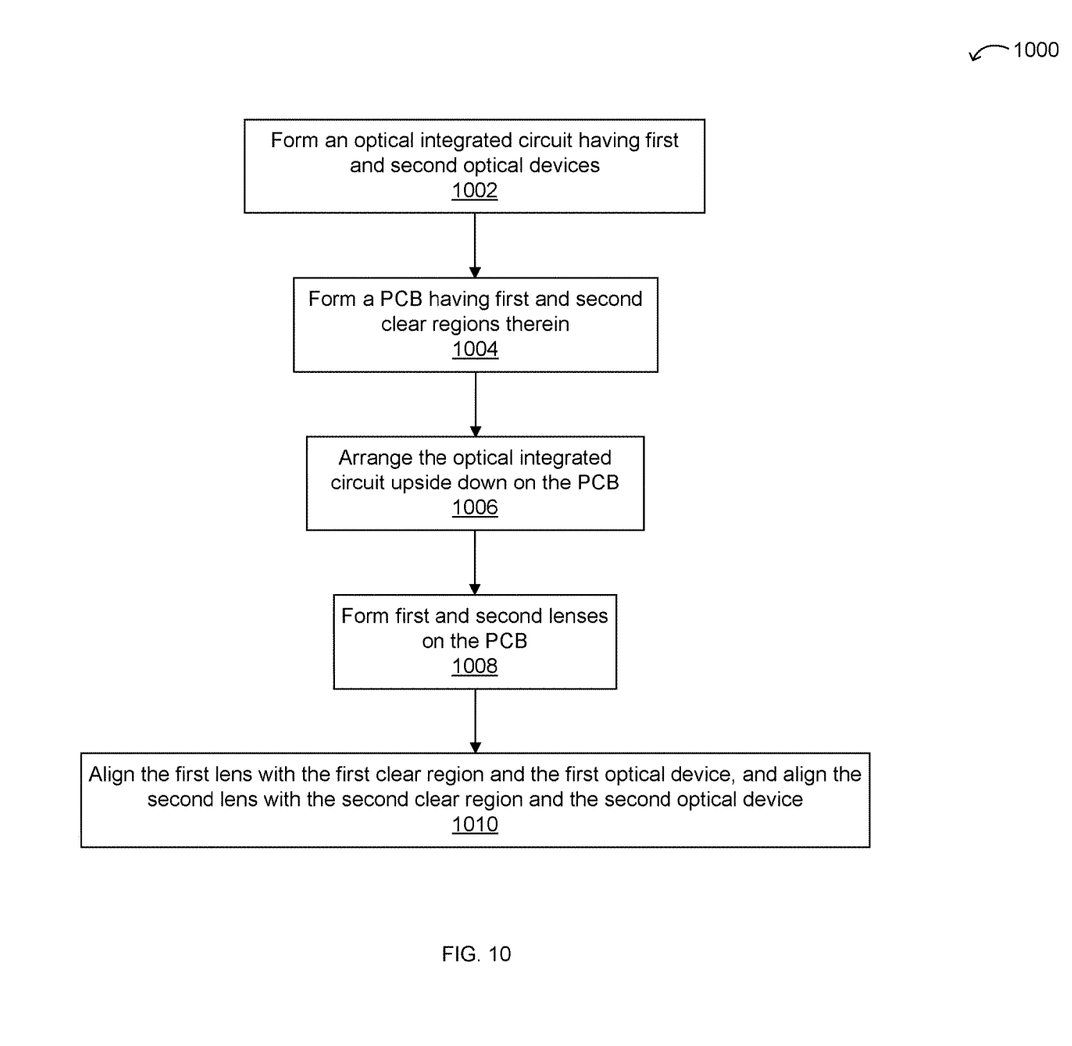
FIG. 10 is a flow diagram of an example method of making an integrated module assembly, in accordance with embodiments of the present invention.

Referring now to FIG. 10, shown is a flow diagram of an example method of making an integrated module assembly, in accordance with embodiments of the present invention. In example 1000, the method can include formation of an optical integrated circuit including first and second optical devices at 1002. For example, this optical integrated circuit can be implemented using WLCSP technology, and may be fully integrated and/or may utilize one or more chiplets. At 1004, a PCB having first and second clear regions (e.g., holes or optically transparent regions) therein can be formed. At 1006, the optical integrated circuit may be arranged upside down on the PCB.

At 1008, first and second lenses can be formed on the PCB. For example, the lenses can be separate lenses (see, e.g., FIG. 3), multiple lenses in a cast module (see, e.g., FIG. 4, and/or the lenses may be integrated within a clear PCB (see, e.g., FIG. 9). At 1010, the first lens can be aligned with the first clear region and the first optical device, and the second lens can be aligned with the second clear region and the second optical device. The alignment can be facilitated by utilizing the PCB holes themselves in some cases, such as in the examples of FIGS. 5 and 6. Of course, the ordering of the various steps shown in FIG. 10 represent but one possible ordering, and any suitable ordering of these particular steps, as well as numbers of steps or sub-steps, can be supported in certain embodiments.

In particular embodiments, various alternatives can be utilized in order to reduce optical reflections between the optical transmitter and the optical receiver. For example, the clear PCB may only need to be clear at proximate locations or regions corresponding to and in alignment with the transmitter and receiver. In this case, the rest of the area can be covered by traces, (matte) black silk screen, or any other suitable material in order to block optical reflections. For example, in very low cost applications, printed traces and glue may be utilized instead of copper traces and solder. Alternatively, a glass/ITO process, as found in liquid crystal display (LCD) panels, can be utilized. In that case, the traces may be clear, and the silk screen can do the blocking of light reflections. Indium tin oxide (ITO) is a ternary composition of indium, tin, and oxygen in varying proportions.

As shown in various examples, one or more solder bumps can be placed directly between the optical transmitter and the optical receiver in order to block the direct light path therebetween. Even though this direct path may be blocked, solder bumps tend to be shiny, and the amount of light coming in through secondary light reflections may actually increase as a result. To help alleviate this potential problem, and/or if the PCB itself becomes an unwanted optical path between transmitter and receiver, one or more vias (e.g., 322) can be placed within the PCB in order to break that unwanted path.

Figure 11:
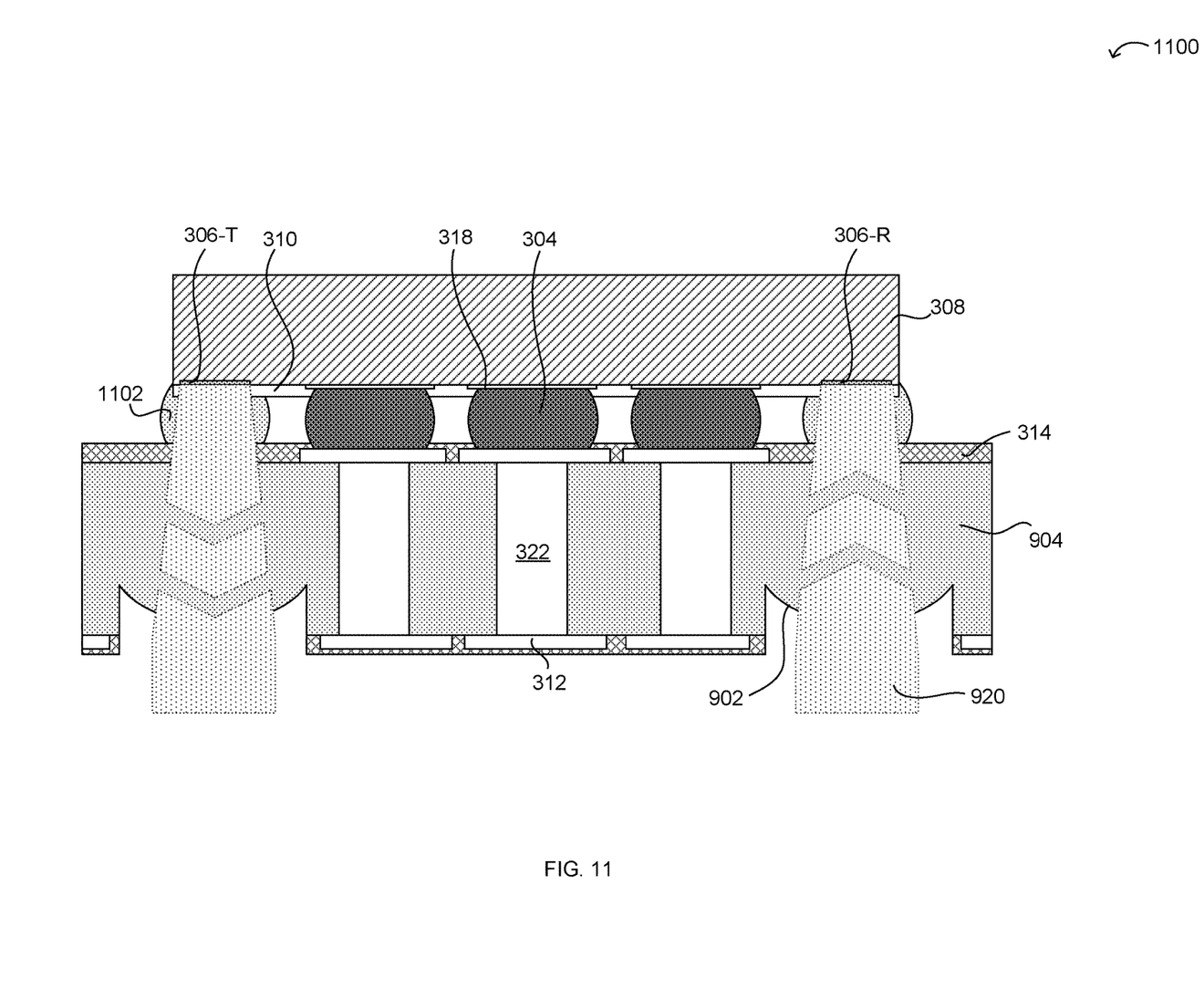
FIG. 11 is a fourth example clear PCB device, in accordance with embodiments of the present invention.

Referring now to FIG. 11, shown is a fourth example clear PCB device, in accordance with embodiments of the present invention. In example 1100, if the air gap between the WLCSP/die and the PCB represents another potential problem, an optically clear underfill material 1102 (e.g., clear silicone, clear epoxy, etc.) can be utilized in that air gap. With an appropriate material choice, there may essentially be two fewer interfaces on each side where the refractive index changes. For example, by selectively only placing the underfill material 1102 at the locations of the transmitter 306-T and receiver 306-R (e.g., one small drop in each location), problems related to air bubbles in the underfill can substantially be avoided, and the optical coupling between the two may accordingly be reduced. Further, the solder balls 304 can generally provide suitable mechanical strength in pairing the WLCSP and the PCB with appropriate dimensions. As another example, in addition to the clear underfill 1102 that lies in the desired optical path, a regular opaque underfill can be added to fill that air gap for the rest of the die. Such an opaque underfill can block additional light, while also increasing mechanical strength, if required.

As shown in FIGS. 8 and 9, e.g., the optical transmitter and optical receiver can be on opposite sides at the edges of the WLCSP/die. This arrangement allows multiple rows of blocking balls (e.g., 304) and vias (e.g., 322) to be placed between the optical transmitter and receiver. Balls can still be near the edge of the die, but not exactly where the optical transmitter/receiver are located. Having the optical transmitter and receiver at the edge may also facilitate the dispensing of a small drop of clear underfill corresponding to each optical device, as discussed above. If lenses are to be added to a clear PCB, there are multiple options supported in certain embodiments. For a glass PCB, these may be separate lenses (see, e.g., FIGS. 7 and 8). For a plastic material, and in some cases for a glass material, the lenses may be molded as part of the PCB, e.g., as shown in FIG. 9. In addition, while only one side of the PCB is shown as molded in FIG. 9, one or both sides of the PCB may be so molded form lenses in certain embodiments.

Particular embodiments may be applicable to an optical distance measurement circuit using infrared light, but can also be used for any other optical circuit using wavelengths where the materials in the optical path are sufficiently transparent, such as (e.g., infrared) image sensors. Certain embodiments can also be extended to a wider optical wavelength range by using different (optically clear) materials (e.g., polyimide materials) as the insulator on top of the WLCSP, which is effectively between the WLCSP and the PCB. Particular embodiments may be especially suitable for manufacturers of systems that need robotic vision, proximity sensing, and/or distance measurement.

The drawings herein primarily show a single optical element (e.g., lens, molded transparent PCB, etc.) in the light path. However, an even more sophisticated optical system can be implemented in certain embodiments by having more than a single optical element, such as by combining the molded PCB shown in FIG. 9 with the external lenses as shown in FIG. 3. This is also exemplified in FIG. 9 with lenses 702 and molded curved lenses 902 in the optical path. In addition, any suitable optical devices can be used in certain embodiments. For example, the optical transmitter may be a LED for a low cost, short range applications, but a VCSEL may provide a more cost-effective in some cases.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An integrated module assembly, comprising:
   a) an optical integrated circuit comprising first and second optical devices in a common silicon die;
   b) a printed-circuit board (PCB) having first and second holes therein, wherein the optical integrated circuit is coupled upside down to a first side of the PCB; and
   c) first and second lenses coupled to a second side of the PCB, wherein the first and second sides of the PCB are opposite thereto, and wherein the first and second lenses are not in contact with the optical integrated circuit and do not completely fill the first and second holes; and
   d) wherein the first lens is in alignment with the first hole and the first optical device, and the second lens is in alignment with the second hole and the second optical device.

2. The integrated module assembly of claim 1, wherein each of the first and second lenses is flat along the second side of the PCB.

3. The integrated module assembly of claim 1, wherein the first and second lenses are formed in a single cast module that is flat along the second side of the PCB.

4. The integrated module assembly of claim 1, wherein the first lens is partially curved within the first hole, and the second lens is curved within the second hole.

5. The integrated module assembly of claim 1, wherein each of the first and second lenses is a spherical ball lens that partially fits inside a corresponding of the first and second holes.

6. The integrated module assembly of claim 1, wherein the optical integrated circuit comprises a wafer level chip scale packaging (WLCSP) device.

7. The integrated module assembly of claim 1, wherein the first optical device comprises an optical transmitter, and the second optical device comprises an optical receiver.

8. The integrated module assembly of claim 1, wherein the optical integrated circuit is coupled upside down to the first side of the PCB by a plurality of solder balls.

9. The integrated module assembly of claim 8, further comprising a via connected to one of the plurality of solder balls, and being positioned between the first and second optical devices.

10. The integrated module assembly of claim 1, wherein each of the first and second holes comprises an optically clear region in the PCB.

11. The integrated module assembly of claim 1, wherein the first lens is in alignment with the first hole and the first optical device along a line that is perpendicular to the first and second sides of the PCB.

12. The integrated module assembly of claim 1, wherein the second lens is in alignment with the second hole and the second optical device along a line that is perpendicular to the first and second sides of the PCB.

13. The integrated module assembly of claim 1, wherein the first and second optical devices are the only optical devices in the integrated module assembly.

14. The integrated module assembly of claim 1, wherein a distance between the first optical device and the first lens equals a distance between the second optical device and the second lens.

* * * * *